(12) United States Patent
Takeuchi

(10) Patent No.: US 7,336,108 B2
(45) Date of Patent: Feb. 26, 2008

(54) SEMICONDUCTOR INTEGRATED CIRCUIT WITH STEPPED-UP VOLTAGE PUMP CIRCUIT

(75) Inventor: Atsushi Takeuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/127,153

(22) Filed: May 12, 2005

(65) Prior Publication Data

US 2005/0200400 A1    Sep. 15, 2005

Related U.S. Application Data

(63) Continuation of application No. PCT/JP03/08212, filed on Jun. 27, 2003.

(51) Int. Cl.
*H03K 3/023* (2006.01)
*G05F 1/575* (2006.01)

(52) U.S. Cl. .................. 327/89; 327/537; 327/544

(58) Field of Classification Search .............. 327/66, 327/77, 78, 89, 535, 537
See application file for complete search history.

(56) References Cited

U.S. PATENT DOCUMENTS

| 4,712,021 | A  | * | 12/1987 | Gollinger ............... 327/66 |
| 5,278,467 | A  | * | 1/1994  | Nedwek ................. 327/52 |
| 5,994,888 | A  |   | 11/1999 | Yanagawa |
| 5,999,020 | A  | * | 12/1999 | Volk et al. .............. 327/67 |
| 6,259,612 | B1 | * | 7/2001  | Itoh ..................... 363/60 |
| 6,297,687 | B1 | * | 10/2001 | Sugimura ............... 327/536 |
| 6,377,074 | B1 |   | 4/2002  | Kono et al. |
| 6,385,117 | B2 | * | 5/2002  | Morishita ............... 365/226 |
| 6,462,613 | B1 | * | 10/2002 | Kleiner et al. ........... 327/544 |
| 6,577,166 | B2 | * | 6/2003  | Lim ..................... 327/77 |
| 6,765,428 | B2 | * | 7/2004  | Kim et al. .............. 327/534 |
| 2001/0050582 | A1 | * | 12/2001 | Shinozaki .............. 327/170 |
| 2004/0066225 | A1 | * | 4/2004  | Seo .................... 327/536 |
| 2004/0145408 | A1 | * | 7/2004  | Ogawa et al. ........... 327/536 |
| 2005/0007187 | A1 | * | 1/2005  | Zhang et al. ............ 327/536 |
| 2005/0127981 | A1 | * | 6/2005  | Lee et al. ............... 327/536 |
| 2006/0291317 | A1 | * | 12/2006 | Takeuchi ............... 365/226 |

FOREIGN PATENT DOCUMENTS

| JP | 5-54649 A     | 3/1993  |
| JP | 9-326194 A    | 12/1997 |
| JP | 11-66855 A    | 3/1999  |
| JP | 2001-68526 A  | 3/2001  |
| JP | 2002-124084 A | 4/2002  |
| JP | 2002-373026 A | 12/2002 |

* cited by examiner

*Primary Examiner*—N. Drew Richards
*Assistant Examiner*—Terry L. Englund
(74) *Attorney, Agent, or Firm*—Arent Fox LLP

(57) ABSTRACT

A semiconductor integrated circuit includes a pump circuit configured to raise an external power supply voltage to generate a stepped-up voltage, and a detector circuit configured to detect the stepped-up voltage generated by the pump circuit to control activation/deactivation of the pump circuit, wherein the detector circuit includes a differential amplifier configured to compare the stepped-up voltage with a reference voltage, and a current control circuit configured to control an amount of a bias current running through the differential amplifier in response to the activation/deactivation of the pump circuit.

14 Claims, 9 Drawing Sheets

PRIOR ART

PRIOR ART

PRIOR ART

SEMICONDUCTOR INTEGRATED CIRCUIT WITH STEPPED-UP VOLTAGE PUMP CIRCUIT

CROSS-REFERENCE TO RELATED APPLICATION

This is a continuation of International Application No. PCT/JP2003/008212, filed on Jun. 27, 2003, the entire contents of which are hereby incorporated by reference.

BACKGROUND OF THE INVENTION

1. Field of the Invention

The present invention generally relates to semiconductor integrated circuits, and particularly relates to a semiconductor integrated circuit provided with an internal power supply circuit such as a stepped-up power supply circuit or stepped-down power supply circuit.

2. Description of the Related Art

In semiconductor integrated circuits, a stepped-up voltage Vpp and/or a stepped-down voltage Vii are generated from an external power supply voltage Vdd for provision to the core circuit. In semiconductor memory devices, for example, a stepped-up voltage Vpp is used to drive a word line or the like, and a stepped-down voltage Vii is used as a power supply voltage in the memory core circuit and peripheral circuits. In order to generate the stepped-up voltage and stepped-down voltage, power supply circuits such as a stepped-up voltage generating circuit and a stepped-down voltage generating circuit are used.

A stepped-up voltage generating circuit includes a detector circuit and a pump circuit. When the detector circuit detects a drop of the stepped-up voltage, the pump circuit is activated in response, thereby raising the stepped-up voltage. FIG. 1 is a circuit diagram showing an example of the configuration of the detector circuit.

The detector circuit of FIG. 1 includes NMOS transistors 11 through 13, PMOS transistors 14 and 15, resistors 16 and 17, and an inverter 18. The resistors 16 and 17 together constitute a potential divider, which divides the stepped-up voltage Vpp. The NMOS transistors 11 through 13 and the PMOS transistors 14 and 15 together constitute a differential amplifier, which supplies to the inverter 18 a voltage responsive to a difference between a reference voltage Vref and the voltage made by dividing the stepped-up voltage Vpp. An output pump_on of the inverter 18 is supplied to the pump circuit. When the stepped-up voltage Vpp drops, the voltage obtained by dividing the stepped-up voltage Vpp becomes smaller than the reference voltage Vref, resulting in the input into the inverter 18 being LOW. As a result, the output pump_on becomes HIGH. In response, the pump circuit is activated to raise the stepped-up voltage Vpp.

FIG. 2 is a diagram showing changes in the stepped-up voltage Vpp. As shown in FIG. 2, the stepped-up voltage Vpp gradually drops due to leak currents in the core circuit during the standby mode of the semiconductor integrated circuit (i.e., the period indicated as pump-off in FIG. 2). When the stepped-up voltage Vpp drops to a predetermined level, the pump circuit is activated to boost the stepped-up voltage Vpp. When the stepped-up voltage Vpp rises to reach a predetermined level, the operation of the pump-circuit is suspended. In FIG. 2, the period during which the pump-circuit operates is indicated as pump-on. Through the operations described above, the stepped-up voltage Vpp is maintained at a constant potential.

In FIG. 1, a bias current Ib1 flowing through the NMOS transistor 11 is set to an amount corresponding to the operation speed required for the pump circuit active in operation (during the pump-on period shown in FIG. 2). If the bias current Ib1 is large, the operation speed of the differential amplifier shown in FIG. 1 is fast, thereby being able to detect a potential change in response to a rapid change in the stepped-up voltage Vpp. If the amount of the bias current Ib1 is insufficient, the operation speed during the pump-on period shown in FIG. 2 becomes insufficient. In this case, the potential detection is delayed, and the stepped-up voltage Vpp experiencing a rapid rise becomes an excessive voltage level exceeding a predetermined level. Because of this, the bias current Ib1 needs to be set to an amount corresponding to the operation speed required during the active operation of the pump circuit.

If the bias current Ib1 is set such as to fit with the operation period of the pump circuit, however, the current consumption of the bias current Ib1 during the pump-off period becomes a needless waste. That is because a large amount of the bias current Ib1 is used despite the fact that high response speed is not required during the pump-off period because changes in the stepped-up voltage Vpp are gradual.

In consideration of the above, there is a need for a configuration that can reduce current consumption in the stepped-up voltage generating circuit during the standby mode.

A needless current is also consumed in the stepped-down voltage generating circuit. FIG. 3 is a diagram showing a portion relating to the stepped-down voltage generating circuit. In FIG. 3, a power-down control circuit 21, a VGI generating circuit 22, NMOS transistors 23 and 24, and a power-down control pad 25 are illustrated. The NMOS transistor 24 serves as the circuit portion that generates the stepped-down voltage. The gate of the NMOS transistor 24 receives a predetermined gate voltage Vgi, with its drain node connected to a power supply voltage Vdd and its source node supplying an internal stepped-down potential Vii. When the stepped-down potential Vii drops due to current consumption in the core circuit, a difference between the gate potential Vgi and the source potential (the stepped-down potential Vii) widens, resulting in an increase in the current flowing through the NMOS transistor 24. In response, the stepped-down potential Vii rises. In this manner, the stepped-down potential Vii is controlled to be a constant potential defined by the gate potential Vgi.

In the configuration shown in FIG. 3, a signal from the exterior to the power-down control pad 25 is asserted during a power-down mode, resulting in an output signal PD of the power-down control circuit 21 becoming HIGH. The NMOS transistor 23 thus becomes conductive, turning the output of the VGI generating circuit 22 to LOW (i.e., a ground potential VSS), resulting in the NMOS transistor 24 being nonconductive. In this manner, the supply of the internal stepped-down voltage Vii to the core circuit is suspended during the power-down mode (for example, see Patent Document 1).

Depending on the type of the semiconductor integrated circuit, there may be a case in which it is desired to set the potential of the internal stepped-down voltage Vii to a voltage slightly higher than an ordinary voltage. In such a case, since there is a limit as to how high the gate voltage Vgi can be raised, it is a general practice to use a transistor having a small threshold voltage as the NMOS transistor 24. If a transistor having a small threshold voltage is used as the NMOS transistor 24, however, the NMOS transistor 24 will not be completely turned off even when the gate voltage Vgi becomes LOW in the power-down mode, resulting in a continuous flow of some electric current. Because of this, current consumption relatively increases during the power-down mode.

In consideration of the above, there is a need to provide a configuration that can reduce current consumption in the stepped-down voltage generating circuit during the power-down mode.

[Patent Document 1] Japanese Patent Application Publication No. 2002-373026.

SUMMARY OF THE INVENTION

It is a general object of the present invention to provide a semiconductor integrated circuit that substantially obviates one or more problems caused by the limitations and disadvantages of the related art.

It is a first specific object of the present invention to provide a semiconductor integrated circuit that can reduce current consumption in the stepped-up voltage generating circuit during the standby mode.

In order to achieve the above objects, a semiconductor integrated circuit according to the present invention includes a pump circuit configured to raise an external power supply voltage to generate a stepped-up voltage, and a detector circuit configured to detect the stepped-up voltage generated by the pump circuit to control activation/deactivation of the pump circuit, wherein the detector circuit includes a differential amplifier configured to compare the stepped-up voltage with a reference voltage, and a current control circuit configured to control an amount of a bias current running through the differential amplifier in response to the activation/deactivation of the pump circuit.

The semiconductor integrated circuit described above can secure a sufficient response speed by increasing the bias current during the period in which the pump circuit is activated, and can reduce needless current consumption by decreasing the bias current during the period in which the pump circuit is deactivated. Provision is thus made to reduce current consumption in the stepped-up voltage generating circuit during the standby mode.

Further, it is a second specific object of the present invention to provide a semiconductor integrated circuit that can reduce current consumption in the stepped-down voltage generating circuit during the power-down mode.

In order to achieve the above objects, a semiconductor integrated circuit according to the present invention includes a voltage generating circuit configured to generate a predetermined voltage, an NMOS transistor configured to receive at a gate node thereof the predetermined voltage generated by said voltage generating circuit, to receive at a drain node thereof an external power supply voltage, and to generate at a source node thereof a stepped-down voltage by reducing the external power supply voltage in response to the predetermined voltage, and a PMOS transistor, provided between the drain node of said NMOS transistor and the external power supply voltage, configured to receive at a gate node thereof a power-down signal indicative of a power-down mode.

The semiconductor integrated circuit described above makes the PMOS transistor nonconductive during the power-down mode so as to reduce a current flowing towards the internal stepped-down potential. With this provision, a consumed current flowing out of the stepped-down potential generating circuit can be reduced during the power-down mode even if the NMOS transistor does not become completely nonconductive during the power-down mode.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 4:
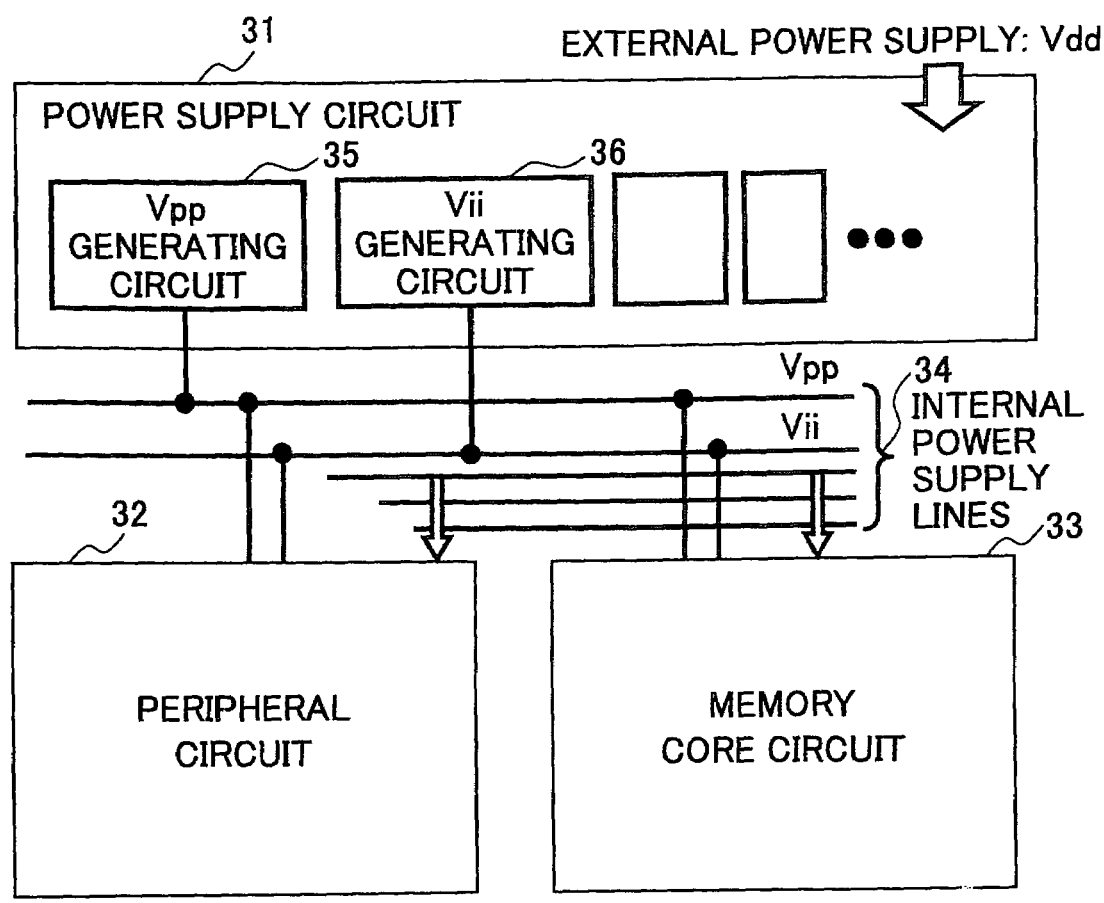
FIG. 4 is a block diagram showing a typical configuration of a semiconductor memory device as an example of a semiconductor integrated circuit to which the present invention is applied.

FIG. 4 is a block diagram showing a typical configuration of a semiconductor memory device as an example of a semiconductor integrated circuit to which the present invention is applied.

The semiconductor memory device of FIG. 4 includes a power supply circuit 31, a peripheral circuit 32, a memory core circuit 33, and internal power supply lines 34. The power supply circuit 31 includes a Vpp generating circuit 35 for generating a stepped-up potential and a Vii generating circuit 36 for generating a stepped-down potential. A stepped-up potential Vpp generated by the Vpp generating circuit 35 and a stepped-down potential Vii generated by the Vii generating circuit 36 are supplied to the peripheral circuit 32 and the memory core circuit 33 via the respective internal power supply lines 34. The semiconductor memory device has an active mode in which data input/output is performed, a standby mode in which data is retained without any data input/output, and a power-down mode in which data is not retained.

Figure 5:
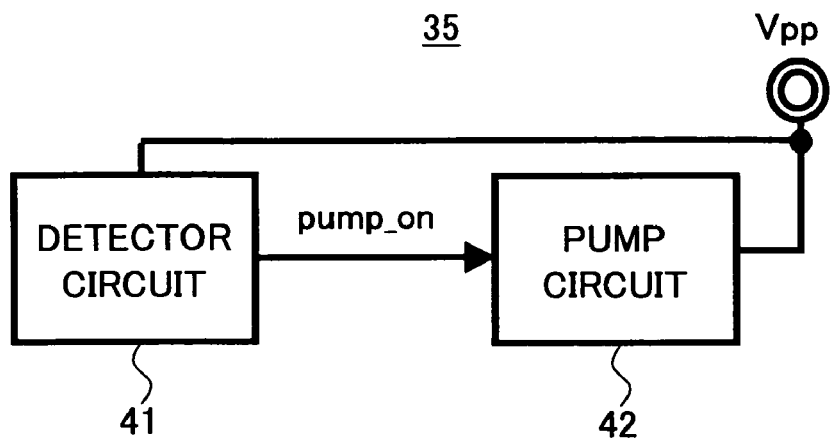
FIG. 5 is a block diagram showing the configuration of a Vpp generating circuit.

FIG. 5 is a block diagram showing the configuration of the Vpp generating circuit 35. The Vpp generating circuit 35 of FIG. 5 includes a detector circuit 41 and a pump circuit 42. When the detector circuit 41 detects a drop in the stepped-up voltage Vpp, the pump circuit 42 is activated in response, thereby raising the stepped-up voltage Vpp.

Figure 6:
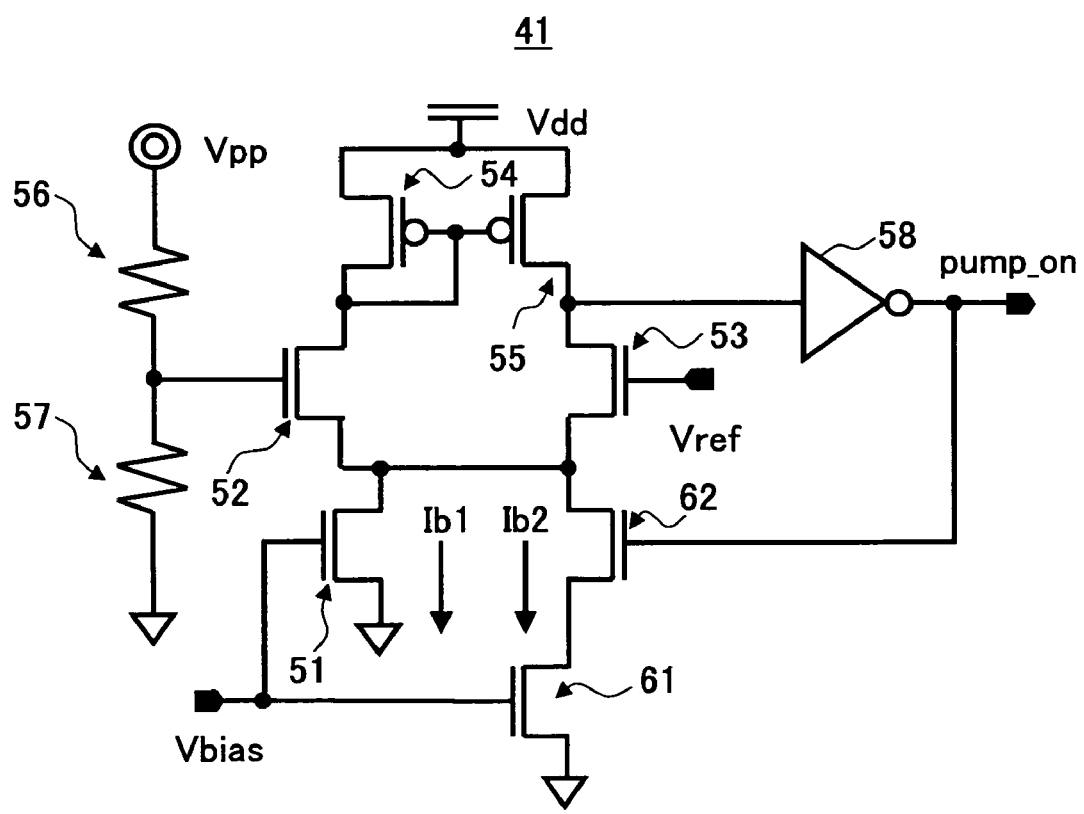
FIG. 6 is a circuit diagram showing an example of the configuration of a detector circuit according to the present invention.

FIG. 6 is a circuit diagram showing an example of the configuration of the detector circuit according to the present invention.

The detector circuit 41 shown in FIG. 6 includes NMOS transistors 51 through 53, PMOS transistors 54 and 55, resistors 56 and 57, an inverter 58, and NMOS transistors 61 and 62. The resistors 56 and 57 together constitute a potential divider, which divides the voltage of the stepped-up voltage Vpp. The NMOS transistors 51 through 53 and the PMOS transistors 54 and 55 together constitute a differential amplifier, which supplies to the inverter 58 a voltage responsive to a difference between a reference voltage Vref and the voltage obtained by dividing the stepped-up voltage Vpp. An output pump_on of the inverter 58 is supplied to the pump circuit 42. When the stepped-up voltage Vpp drops, the voltage obtained by dividing the stepped-up voltage Vpp becomes lower than the reference voltage Vref, resulting in the input into the inverter 58 being LOW. As a result, the output pump_on becomes HIGH. In response, the pump circuit 42 is activated to raise the stepped-up voltage Vpp.

In the detector circuit 41 according to the present invention, the NMOS transistors 61 and 62 are provided. The gate of the NMOS transistor 62 receives the output pump_on of the inverter 58. With this provision, the NMOS transistor 62 becomes conductive during the period in which the pump circuit 42 is activated.

Figure 1:
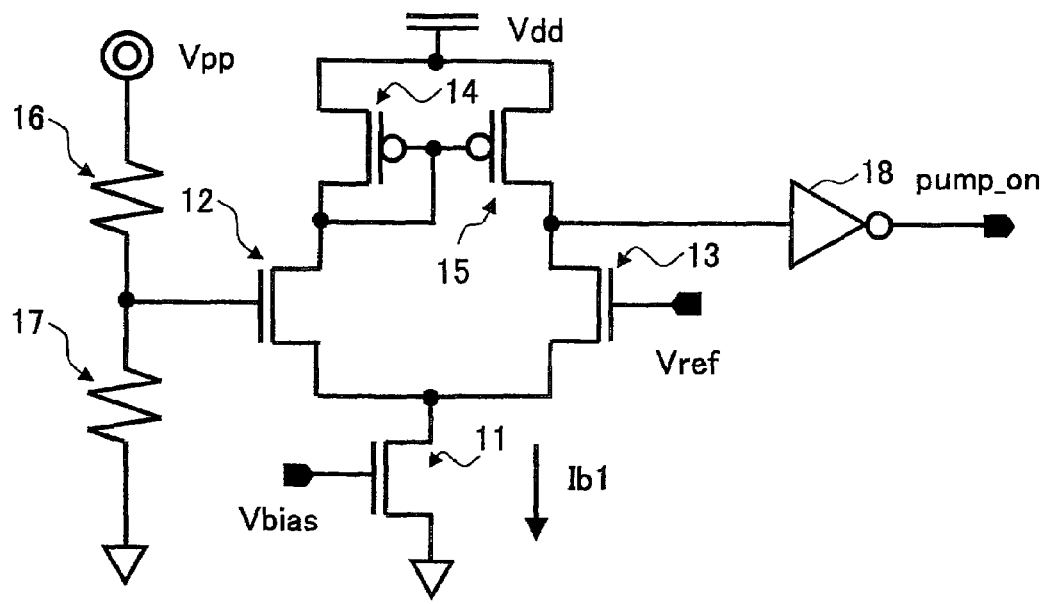
FIG. 1 is a circuit diagram showing an example of the configuration of a detector circuit.
Figure 2:
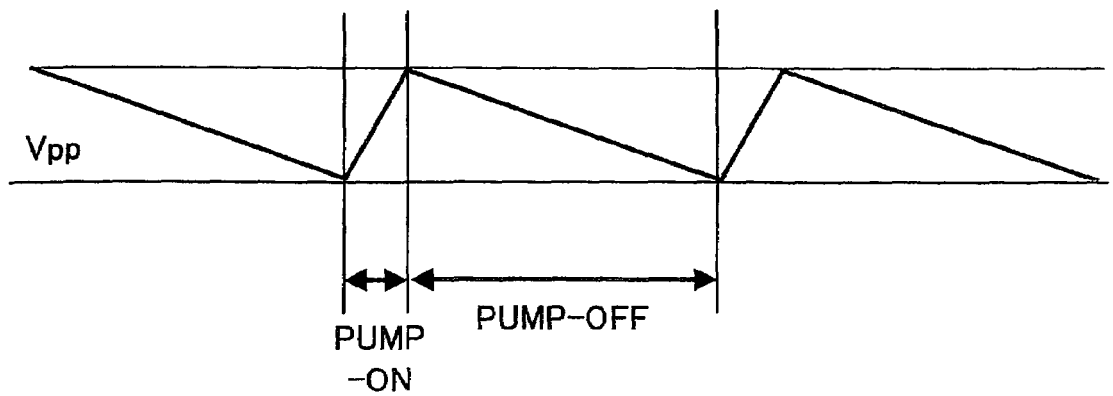
FIG. 2 is a diagram showing changes in a stepped-up voltage.
Figure 3:
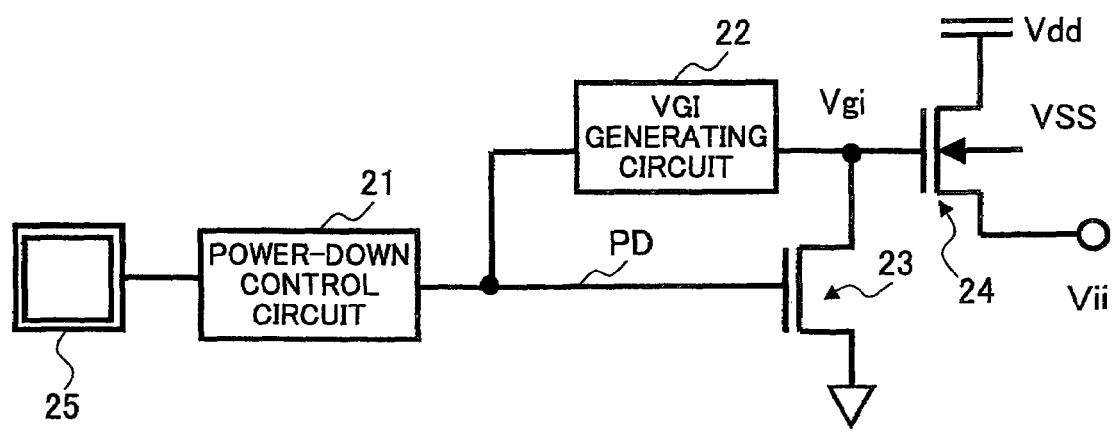
FIG. 3 is a diagram showing a portion relating to a stepped-down voltage generating circuit.

If a combined current of a current Ib1 running through the NMOS transistor 51 and a current Ib2 running through the NMOS transistor 62 is large, the response speed of the differential amplifier shown in FIG. 6 is fast, thereby being able to detect a potential change in response to a rapid change in the stepped-up voltage Vpp. In the present invention, the combined bias current Ib1+Ib2 is set to a large amount during the period in which the pump circuit 42 is activated (i.e., the pump-on period shown in FIG. 2), thereby securing a sufficient response speed. On the other hand, the combined bias current is set to a small amount during a period in which the pump circuit 42 is deactivated (i.e., the pump-off period shown in FIG. 2), thereby reducing needless current consumption. Provision is thus made to reduce current consumption in the semiconductor memory device during the standby mode.

The NMOS transistor 61 is driven by a gate voltage Vbias applied to the NMOS transistor 51, and serves as a current source in the same manner as the NMOS transistor 51. Since the NMOS transistor 62 only serves as a switch that is merely turned on or turned off, the use of the NMOS transistor 62 alone results in an excessive current flowing through the differential amplifier. The NMOS transistor 61 serving as a current source is thus provided to adjust the amount of the current Ib2.

Figure 7:
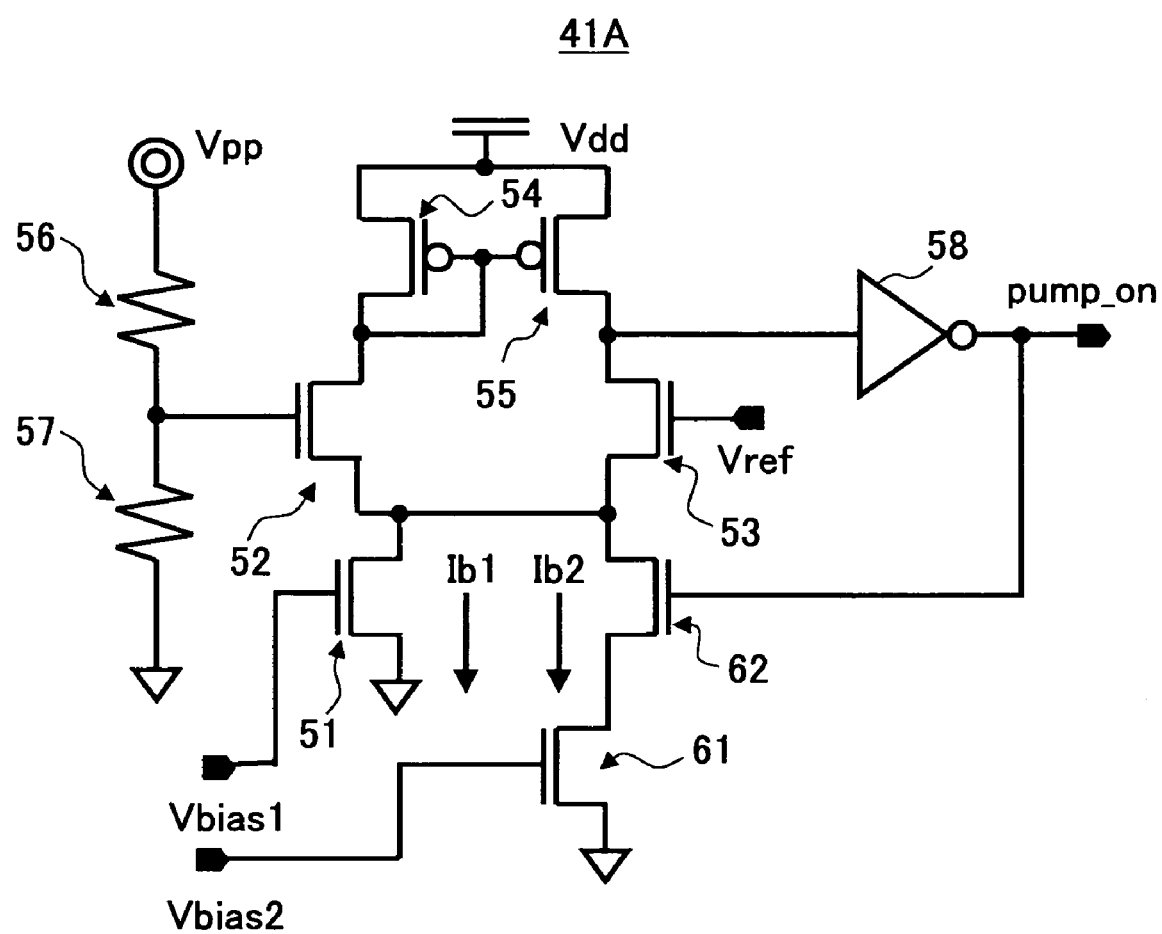
FIG. 7 is a circuit diagram showing the configuration of another embodiment of the detector circuit.

FIG. 7 is a circuit diagram showing the configuration of another embodiment of the detector circuit. In FIG. 7, the same elements as those of FIG. 6 are referred to by the same numerals, and a description thereof will be omitted.

In a detector circuit 41A shown in FIG. 7, the gate potential of the NMOS transistor 51 and the gate potential of the NMOS transistor 61 are set to potentials Vbias1 and Vbias2, respectively, which are independent of each other. Other than this, the configuration is the same as that of the detector circuit 41 shown in FIG. 6. With the configuration of FIG. 6, the current Ib1 and the current Ib2 have the same current amount if the NMOS transistors 51 and 61 have the same characteristics. With the configuration shown in FIG. 7, on the other hand, it is possible to set the current Ib1 and the current Ib2 to respective, different current amounts.

Figure 8:
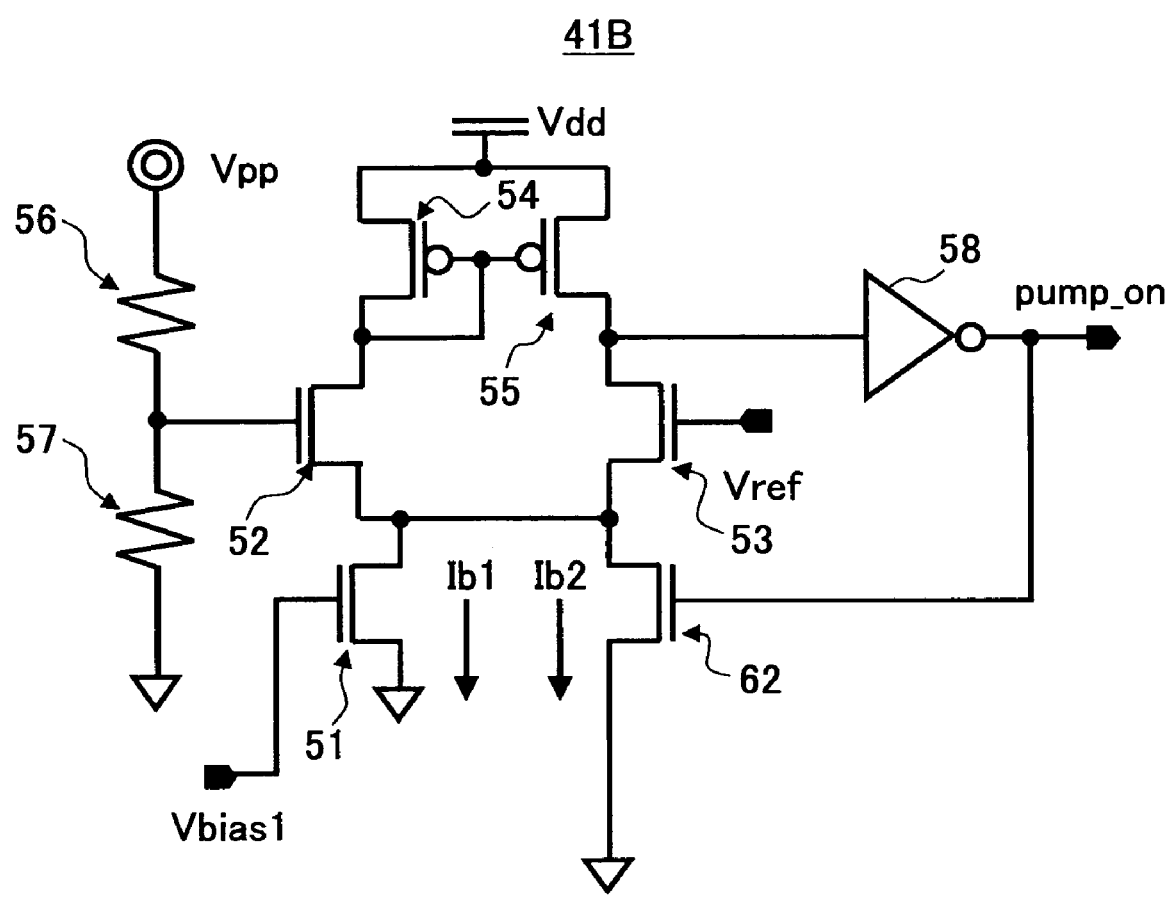
FIG. 8 is a circuit diagram showing the configuration of a further embodiment of the detector circuit.

FIG. 8 is a circuit diagram showing the configuration of a further embodiment of the detector circuit. In FIG. 8, the same elements as those of FIG. 6 are referred to by the same numerals, and a description thereof will be omitted.

In a detector circuit 41B shown in FIG. 8, the NMOS transistor 61 that is present in FIG. 6 is removed. Other than this, the configuration is the same as that of the detector circuit 41 shown in FIG. 6. As was previously described, the NMOS transistor 62 in the configuration of FIG. 6 only serves as a switch that is merely turned on or turned off, and the NMOS transistor 61 serving as a current source is thus provided to adjust the amount of the current Ib2. In the configuration shown in FIG. 8, the NMOS transistor 61 serving as a current source is removed, and the NMOS transistor 62 alone is used to adjust the current amount. Namely, the amount of the current flowing through the NMOS transistor 62 when the NMOS transistor 62 is in the on state is defined by the voltage between the gate and source of the NMOS transistor 62. In order to adjust the current amount to a proper amount in this case, adjustment may be made to the channel size of the NMOS transistor. The method of adjusting the current amount of the detector circuit used in FIG. 6, FIG. 7, and FIG. 8 may also be used for voltage detection in a negative-potential power supply.

Figure 9:
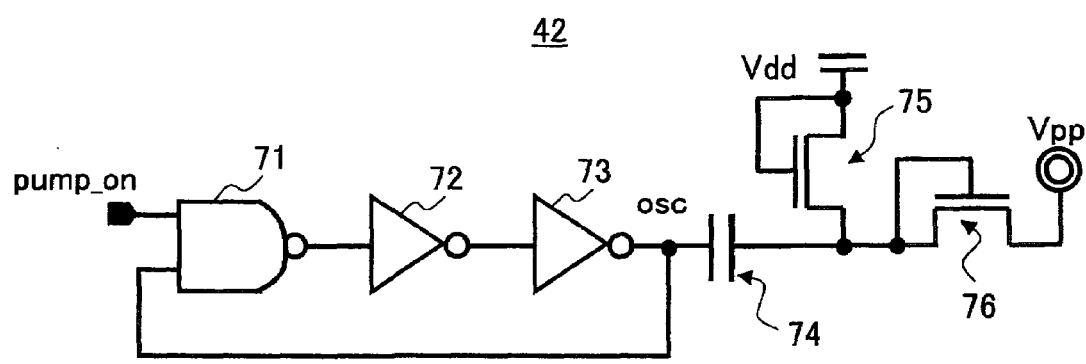
FIG. 9 is a circuit diagram showing an example of the circuit configuration of a pump circuit.

FIG. 9 is a circuit diagram showing an example of the circuit configuration of the pump circuit 42.

The pump circuit 42 of FIG. 9 includes a NAND circuit 71, inverters 72 and 73, a capacitor 74, and NMOS transistors 75 and 76. As the signal pump_on from the detector circuit 41 becomes HIGH, a ring oscillator comprised of the NAND circuit 71 and the inverters 72 and 73 starts to oscillate. Voltage changes in each cycle of the oscillation of the ring oscillator propagate to the NMOS transistors 75 and 76 via a capacitance coupling of the capacitor 74. Due to the voltage changes in each cycle of the oscillation, electric charge supplied from the power supply voltage Vdd accumulates cumulatively, resulting in the stepped-up potential Vpp higher than the power supply voltage Vdd being generated.

Figure 10:
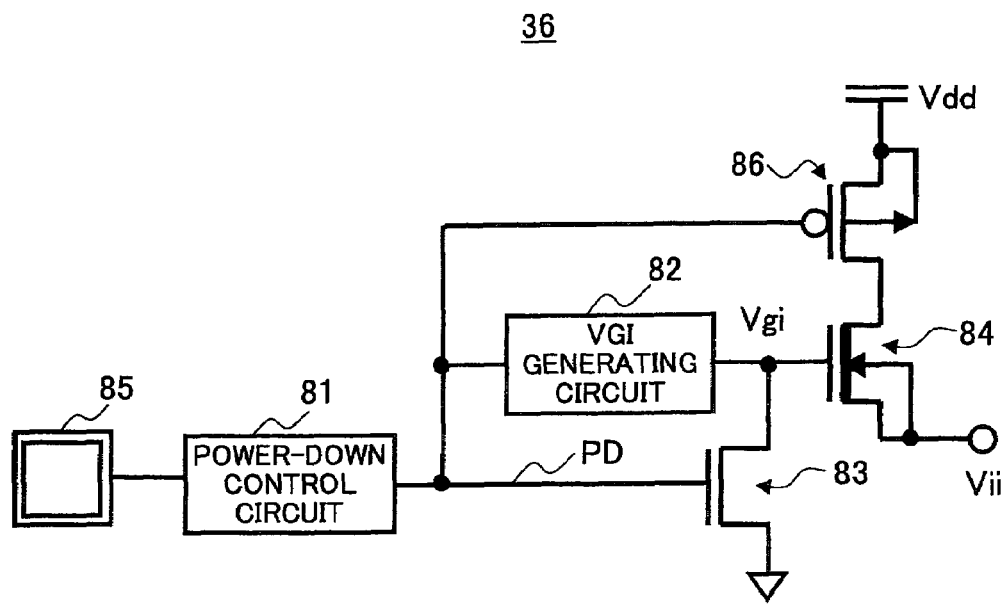
FIG. 10 is a circuit diagram showing an example of the circuit configuration of a Vii generating circuit according to the present invention.

FIG. 10 is a circuit diagram showing an example of the circuit configuration of the Vii generating circuit 36 according to the present invention.

The Vii generating circuit 36 shown in FIG. 10 includes a power-down control circuit 81, a VGI generating circuit 82, NMOS transistors 83 and 84, a power-down control pad 85, and an NMOS transistor 86. The NMOS transistor 84 serves as the circuit portion that generates the stepped-down voltage. The gate of the NMOS transistor 84 receives a predetermined gate voltage Vgi, with its drain node connected to the power supply voltage Vdd and its source node supplying the internal stepped-down potential Vii. When the stepped-down potential Vii drops due to current consumption in the core circuit, a difference between the gate potential Vgi and the source potential (the stepped-down potential Vii) widens, resulting in an increase in the current flowing through the NMOS transistor 84. In response, the stepped-down potential Vii rises. In this manner, the stepped-down potential Vii is controlled to be a constant potential defined by the gate potential Vgi.

A signal from the exterior to the power-down control pad 85 is asserted during a power-down mode, resulting in an output signal PD of the power-down control circuit 81 becoming HIGH. The NMOS transistor 83 thus becomes conductive, turning the output of the VGI generating circuit 82 to LOW (i.e., the ground potential VSS), which results in the NMOS transistor 84 being nonconductive. In this manner, the supply of the internal stepped-down voltage Vii to the core circuit is suspended during the power-down mode.

In the configuration shown in FIG. 10, the potential of the internal stepped-down voltage Vii may be set to a voltage slightly higher than an ordinary potential. To this end, an NMOS transistor having a low threshold voltage is used, and the source potential is coupled to the substrate potential, thereby removing a back-bias effect. This reduces the threshold voltage of the NMOS transistor 84.

In the present invention, the PMOS transistor 86 is further provided, with its gate node receiving the output signal PD of the power-down control circuit 81 that becomes HIGH during the power-down mode. The PMOS transistor 86 thus becomes nonconductive during the power-down mode, so that a current flowing toward the internal stepped-down potential Vii decreases. With this provision, it is possible to reduce the consumption of the current flowing out of the Vii generating circuit 36 during the power-down mode even if the NMOS transistor 84 does not become completely nonconductive during the power-down mode.

Figure 11:
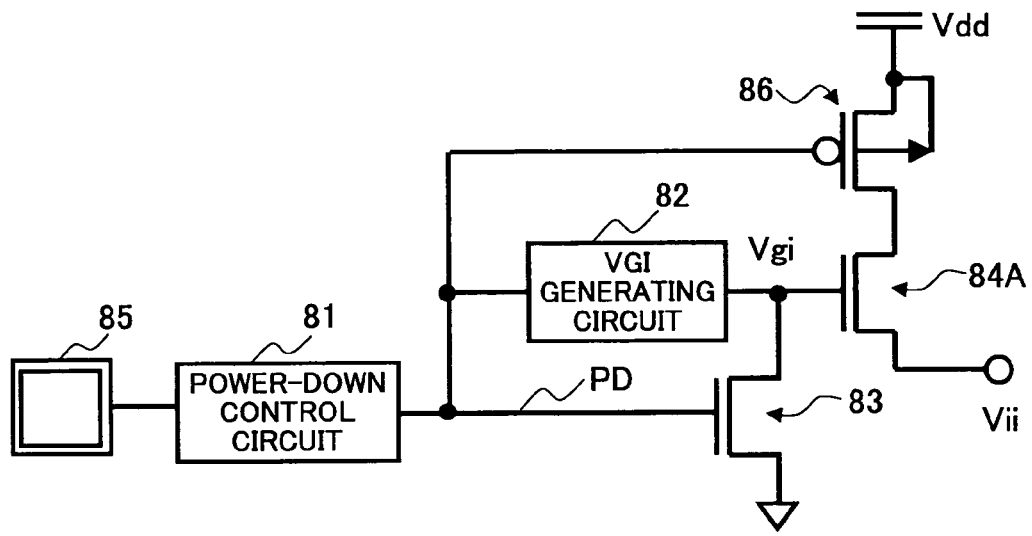
FIG. 11 is a circuit diagram showing another example of the circuit configuration of the Vii generating circuit according to the present invention.

FIG. 11 is a circuit diagram showing another example of the circuit configuration of the Vii generating circuit according to the present invention. In FIG. 11, the same elements as those of FIG. 10 are referred to by the same numerals, and a description thereof will be omitted.

In a Vii generating circuit 36A shown in FIG. 11, an NMOS transistor 84A having an ordinary threshold voltage is provided in place of the NMOS transistor 84 having a low threshold voltage shown in FIG. 10. Other than this, the configuration is the same as that shown in FIG. 10. The configuration shown in FIG. 11 also can reduce the consumption of the current flowing out of the Vii generating circuit 36A during the power-down mode.

Figure 12:
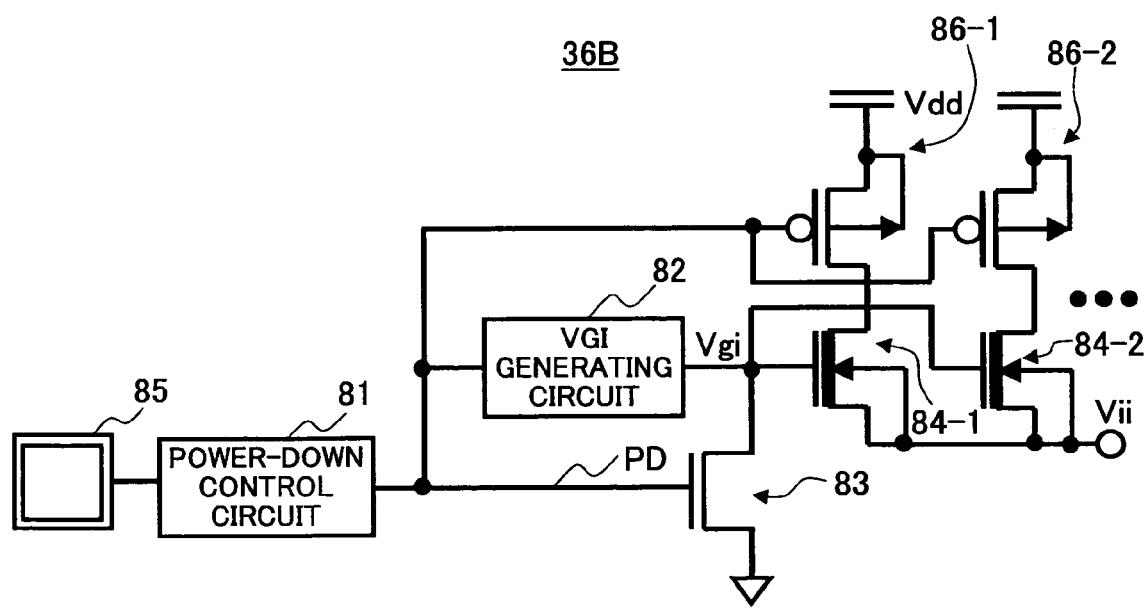
FIG. 12 is a circuit diagram showing another example of the circuit configuration of the Vii generating circuit according to the present invention.

FIG. 12 is a circuit diagram showing another example of the circuit configuration of the Vii generating circuit according to the present invention. In FIG. 12, the same elements as those of FIG. 10 are referred to by the same numerals, and a description thereof will be omitted.

In a Vii generating circuit 36B shown in FIG. 12, a plurality of NMOS transistors 84-1, 84-2, . . . are provided in place of the NMOS transistor 84 shown in FIG. 10. Further, a plurality of PMOS transistors 86-1, 86-2, . . . , are provided in place of the PMOS transistor 86 shown in FIG. 10. The plurality of PMOS transistors 84-1, 84-2, . . . and the plurality of NMOS transistors 86-1, 86-2, . . . are arranged in a spaced-apart manner at different locations in the semiconductor memory device, and supply the internal stepped-down voltage Vii at the respective positions where they are located within the semiconductor memory device. Other than this, the configuration is the same as that shown in FIG. 10.

Figure 13:
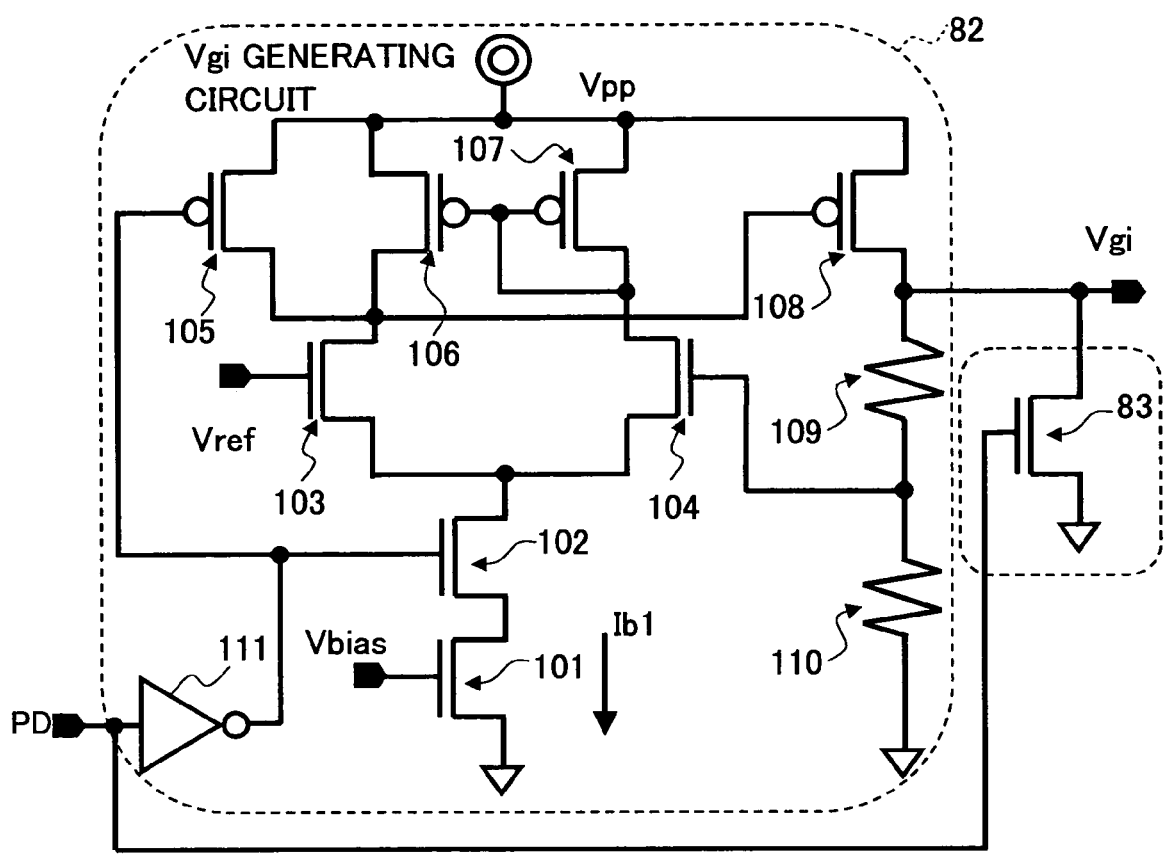
FIG. 13 is a circuit diagram showing the circuit configuration of a VGI generating circuit.

FIG. 13 is a circuit diagram showing the circuit configuration of the VGI generating circuit 82.

The VGI generating circuit 82 includes NMOS transistors 101 through 104, PMOS transistors 105 through 108, resistors 109 and 110, and an inverter 111. The NMOS transistors 101 through 104 and the PMOS transistors 106 and 107 together constitute a differential amplifier, and the resistors 109 and 110 together constitute a potential divider. The potential divider divides the output voltage Vgi, and the divided voltage is compared with the reference potential Vref by the differential amplifier. A voltage responsive to the difference between the divided voltage and the reference potential Vref drives the PMOS transistor 108, thereby generating the output signal Vgi. In this manner, the VGI generating circuit 82 adjusts the output signal Vgi to a desired voltage level through feedback control.

During the power-down mode, the power-down signal PD becomes HIGH, so that the output of the inverter 111 becomes LOW. In response, the NMOS transistor 102 becomes nonconductive, resulting in the operation of the differential amplifier being suspended. At this time, the output signal Vgi of the VGI generating circuit 82 is clamped to the ground potential via the NMOS transistor 83 provided for the clamping purpose.

Further, the present invention is not limited to these embodiments, but various variations and modifications may be made without departing from the scope of the present invention.

What is claimed is:

1. A semiconductor integrated circuit, comprising:
   a pump circuit configured to raise an external power supply voltage to generate a stepped-up voltage; and
   a detector circuit configured to detect the stepped-up voltage generated by said pump circuit to control activation/deactivation of said pump circuit,
   wherein said detector circuit includes:
   a differential amplifier configured to compare the stepped-up voltage with a fixed reference voltage; and
   a current control circuit configured to set an amount of a bias current running through said differential amplifier to a first amount in response to the activation of an entirety of said pump circuit, and to set the amount of the bias current running through said differential amplifier to a second amount in response to the deactivation of the entirety of said pump circuit,
   wherein said current control circuit includes:
   a first transistor configured to be in a conductive state at all times;
   a second transistor having a conductive/nonconductive state thereof controlled in response to a signal that controls the activation/deactivation of said pump circuit; and
   a third transistor connected in series with said second transistor, said first transistor and said third transistor receiving substantially the same gate voltage,
   wherein the bias current is a sum of a current running through the first transistor and a current running through the second transistor.

2. The semiconductor integrated circuit as claimed in claim 1, further comprising;
   a memory core circuit; and
   an internal power supply line coupled between the pump circuit and the memory core circuit to supply the stepped-up voltage to the memory core circuit.

3. The semiconductor integrated circuit as claimed in claim 2, further comprising a peripheral circuit, coupled to the internal power supply line, and configured to receive the stepped-up voltage.

4. The semiconductor integrated circuit as claimed in claim 1, further comprising a divider configured to divide the stepped-up voltage and output the divided voltage to the differential amplifier, wherein the differential amplifier compares the divided stepped-up voltage with the fixed reference voltage.

5. A semiconductor integrated circuit, comprising:
a pump circuit configured to raise an external power supply voltage to generate a stepped-up voltage; and
a detector circuit configured to detect the stepped-up voltage generated by said pump circuit to control activation/deactivation of said pump circuit,
wherein said detector circuit includes:
a differential amplifier configured to compare the stepped-up voltage with a fixed reference voltage; and
a current control circuit configured to set an amount of a bias current running through said differential amplifier to a first amount in response to the activation of an entirety of said pump circuit, and to set the amount of the bias current running through said differential amplifier to a second amount in response to the deactivation of the entirety of said pump circuit,
wherein said current control circuit includes:
a first transistor configured to be in a conductive state at all times;
a second transistor having a conductive/nonconductive state thereof controlled in response to a signal that controls the activation/deactivation of said pump circuit; and
a third transistor connected in series with said second transistor, said first transistor and said third transistor receiving respective different gate voltages,
wherein the bias current is a sum of a current running through the first transistor and a current running through the second transistor.

6. The semiconductor integrated circuit as claimed in claim 5, further comprising:
a memory core circuit; and
an internal power supply line coupled between the pump circuit and the memory core circuit to supply the stepped-up voltage to the memory core circuit.

7. The semiconductor integrated circuit as claimed in claim 6, further comprising a peripheral circuit coupled to the internal power supply line, and configured to receive the stepped-up voltage.

8. A semiconductor integrated circuit comprising:
a pump circuit configured to raise an external power supply voltage to generate a stepped-up voltage; and
a detector circuit, coupled to the pump circuit, configured to receive the stepped-up voltage generated by the pump circuit to output to the pump circuit either an activation signal or a deactivation signal, which indicates an activation or deactivation state of the pump circuit, respectively, wherein said detector circuit includes:
a differential amplifier configured to receive the stepped-up voltage and a reference voltage; and
a current control circuit, coupled to the differential amplifier, which includes;
(i) a first transistor configured to receive a bias voltage;
(ii) a second transistor configured to receive either the activation signal or the deactivation signal; and
(iii) a third transistor, coupled in series with the second transistor, configured to receive either the bias voltage received by the first transistor, or another bias voltage, the series coupled second and third transistors being coupled in parallel with the first transistor.

9. The semiconductor integrated circuit as claimed in claim 8, wherein the second transistor is configured to be in a conductive state in response to the activation signal and to be in a non-conductive state in response to the deactivation signal.

10. The semiconductor integrated circuit as claimed in claim 8, further comprising:
a memory core circuit; and
an internal power supply line coupled between the pump circuit and the memory core circuit to supply the stepped-up voltage to the memory core circuit.

11. The semiconductor integral circuit as claimed in claim 10, further comprising a peripheral circuit coupled to the internal power supply line and configured to receive the stepped-up voltage.

12. The semiconductor integrated circuit as claimed in claim 8, wherein the current control circuit controls an amount of a bias current running through said differential amplifier in response to the activation signal and the deactivation signal.

13. The semiconductor integrated circuit as claimed in claim 12, wherein the bias current is a sum of a current running through the first transistor and a current running through the second transistor.

14. A semiconductor integrated circuit comprising:
a pump circuit configured to raise an external power supply voltage to generate a stepped-up voltage; and
a detector circuit configured to detect the stepped-up voltage generated by said pump circuit to control activation/deactivation of said pump circuit,
wherein said detector circuit includes;
a differential amplifier configured to compare the stepped-up voltage with a fixed reference voltage;
a current control circuit configured to set an amount of a bias current running through said differential amplifier to a first amount in response to the activation of an entirety of said pump circuit, and to set the amount of the bias current running through said differential amplifier to a second amount in response to the deactivation of the entirety of said pump circuit;
a potential divider configured to divide the stepped-up voltage and to output the divided voltage to the differential amplifier; and
a buffer, coupled at an input thereof to the differential amplifier, and configured to output a signal that controls the activation/deactivation of said pump circuit;
wherein said current control circuit includes:
a first transistor configured to be in a conductive state at all times;
a second transistor having a conductive/nonconductive state controlled by receiving at a gate node the signal outputted from the buffer that controls the activation/deactivation of said pump circuit, the second transistor being coupled in parallel with the first transistor between the differential amplifier and a voltage smaller than the external power supply voltage.

* * * * *